United States Patent [19]

Dutkiewicz

[11] Patent Number: 5,539,780
[45] Date of Patent: Jul. 23, 1996

[54] COMPUTATIONALLY EFFICIENT DATA DECODER AND METHOD USED THEREIN

[75] Inventor: Marek Dutkiewicz, Delta, Canada

[73] Assignee: Motorola, Inc., Schaumburg, Ill.

[21] Appl. No.: 145,059

[22] Filed: Oct. 28, 1993

[51] Int. Cl.$^6$ .............................. H03D 1/00; H04L 27/06; G06F 11/10; H03M 13/12
[52] U.S. Cl. ................................ 375/340; 371/43
[58] Field of Search .................... 375/39, 94, 95, 375/98, 99, 101, 76, 340; 371/43

[56] References Cited

U.S. PATENT DOCUMENTS

| | | | |
|---|---|---|---|
| 4,015,238 | 3/1977 | Davis | 340/146 |
| 4,309,772 | 1/1982 | Kloker et al. | 375/94 |
| 4,700,349 | 10/1987 | Gallager | 371/30 |
| 5,010,554 | 4/1991 | Bechtel et al. | 371/37.1 |
| 5,111,483 | 5/1992 | Serfaty | 375/94 |
| 5,134,635 | 7/1992 | Hong et al. | 375/94 |
| 5,144,644 | 9/1992 | Borth | 375/96 |
| 5,363,413 | 11/1994 | Vos | 375/94 |

OTHER PUBLICATIONS

*Soft Decision Decoding of Block Codes Using Received Signal Envelope in Digital Mobile Radio*, IEEE Journal on Selected Areas in Communications, vol. 7, No. 1, Jan. 1989, pp. 107–113.

*Primary Examiner*—Edward L. Coles, Sr.
*Assistant Examiner*—Thomas D. Lee
*Attorney, Agent, or Firm*—Charles W. Bethards

[57] ABSTRACT

A computationally efficient data decoder that includes a measurement function (18) for providing a channel quality indication, an index function (35) for selecting, responsive to the channel quality indication, a predetermined value representative of a simple machine operation, and decision circuit (27) that weights a decoder decision by performing the simple machine operation.

14 Claims, 3 Drawing Sheets

DEMODULATED SYMBOL SEQUENCE=+1-1+1-1+3+3

RECEIVER DECODED WORD=110000    1 BIT IN ERROR

RECEIVER DECODED WORD=010000  NO BITS IN ERROR

COMPUTATIONALLY EFFICIENT DATA DECODER AND METHOD USED THEREIN

FIELD OF THE INVENTION

This disclosure generally concerns data decoders and more specifically, but not limited to, computationally efficient data decoders.

BACKGROUND OF THE INVENTION

Practitioners continually strive for improved data transport accuracy and reliability. These may be especially difficult objectives when the data channel is subject to noise interference, large signal power variations, or multi-path fading. The latter two situations are often encountered in radio data communications systems. Large signal power variations are encountered because radio signal path loss may vary over literally orders of magnitude. Additional variations are encountered due to Rayleigh fading when the transmitting device and receiving device are in relative motion.

The literature is replete with analysis of the properties of radio signals as propagated and little is served by further review here. The net of all these properties is that the receiving device will encounter a signal whose average signal strength may vary over literally orders of magnitude. This signal will be a composite of several incident signals, of varying phase, and thus subject to periodic large reductions in signal power (fades) exhibiting rapid phase and small frequency variations during these fades.

Various techniques for addressing certain of these various properties have been developed. Among such techniques are encoding the data to be transported to allow for error correction at a decoder. One form of data encoding that has been developed and used is convolutional or trellis encoding, wherein the transmitted symbols depend not only on the data to be transported but also on previous data that has been transported. This technique works well in additive white noise situations and has been adapted to various specific transport environments. Furthermore an optimum decoder, at least for additive gaussian noise channels, may be implemented. This decoder is variously known as a Viterbi or trellis type decoder.

Convolutional encoding, notwithstanding advantages, does have limitations and may not always adequately compensate for the conditions encountered during a fade, specifically the impact on a particular symbol. To address this, inner and outer codes have been proposed wherein the coding steps nearest the channel are selected for their ability to at least "mark" particular symbols where circumstances, such as a fade, dictate low confidence in the channel during the corresponding symbol time. This technique, relying on the properties of certain codes, is known as detecting an erasure and is one way of using confidence in the communications channel to improve data transport integrity. This approach does require multiple encoders and decoders.

Other approaches have been developed, to directly assess a confidence level in the channel. These rely on measuring particular properties of the received signal that may be peculiar to or result from a faded signal. They include measuring and associating a received signal strength indication (RSSI), as a proxy for channel confidence, with each symbol to facilitate the decoding process. The association of RSSI, including variations thereof, with each symbol typically includes one or more computationally complex multiplication processes. As one example of such a process, the reader is referred to U.S. Pat. No. 5,363,413 to Vos granted Nov. 8, 1994 and assigned to the same assignee as here. All of these known approaches suffer from computational complexity that in turn may disadvantage end products in economic terms as well as physical size and battery life.

The computational complexity issue is self evident with the multiple encoder and decoder approaches. It is also a concern with trellis decoders where ordinarily calculations for all possible decoder decisions are performed and a final decoder derision is made as the optimum result from all possible decoder decisions. Clearly a need exists for a computationally efficient data decoder that resolves the above noted inadequacies.

BRIEF DESCRIPTION OF THE DRAWINGS

The features of the present invention which are believed to be novel are set forth with particularity in the appended claims. However, the invention together with further advantages thereof, may best be understood by reference to the accompanying drawings in which:

DETAILED DESCRIPTION OF A PREFERRED EMBODIMENT

Generally this disclosure deals with apparatus and methods for implementing a data decoder that avoids computationally complex operations, such as multiplication that other prior art decoders have utilized. In a preferred embodiment, this is accomplished by substituting an absolute value operation for a here to fore off used squaring operation and further substituting simple logical operations for a multiplication step normally utilized for a weighting operation.

Figure 1:
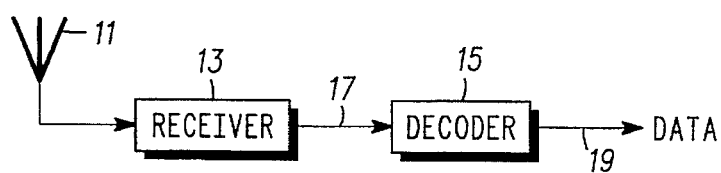
FIG. 1 is a block diagram of a data receiver employing an embodiment of the instant invention.

For a more detailed description the reader is referred to the FIGs in which FIG. 1 depicts an antenna (11) coupled to a receiver (13). The receiver (13) receives a signal on the channel, here a radio channel, and provides a signal including data symbols to a decoder (15) at input (17). The decoder (15) operates to decode the symbols and provide data at output (19).

Figure 2:
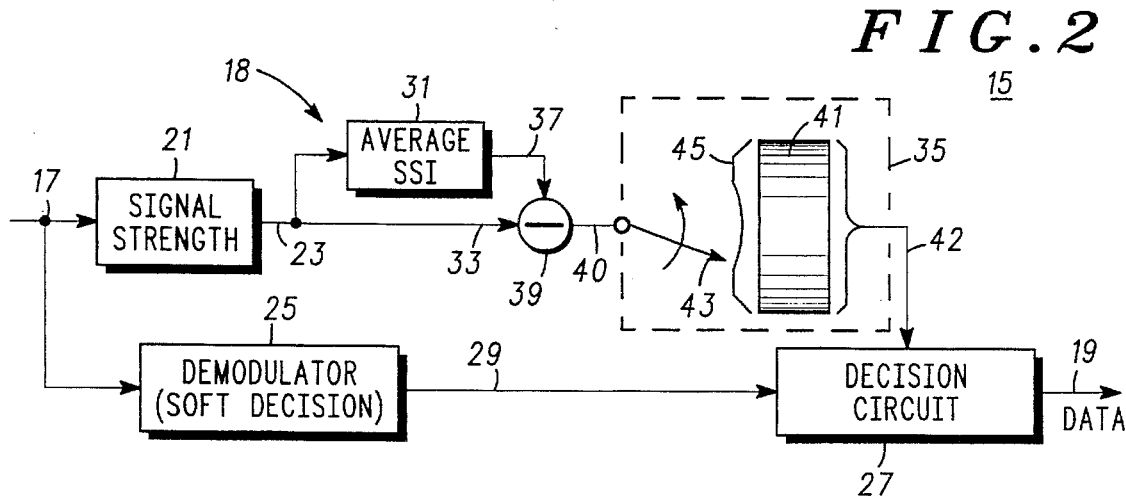
FIG. 2 is a block diagram of a data decoder in accordance with an embodiment of the instant invention.

Referring to FIG. 2 where like reference numerals refer to like elements from FIG. 1, an embodiment of the decoder (15), with input (17) and output (19), is shown. The signal at input (17) may include a number of multi-path signals, each having symbols, representing encoded data modulated thereon, and additive noise due to the channel or receiver. Each symbol will have an associated symbol time period, a period of time where the symbol will impact the signal.

At any rate this signal is coupled to a measurement function (18) that operates to provide a channel quality indication that corresponds to a symbol time period. The measurement function (18) includes a signal strength apparatus (21), an averaging apparatus (31), and a difference circuit (39) all arranged and inter coupled as depicted in FIG. 2. The signal strength apparatus (21) provides, at output (23) in a digital format, a signal strength indication of the signal that corresponds to a symbol time period. The signal strength apparatus (21) may be implemented by, for example, sensing the current drawn by an amplifier stage that is subjected to the signal strength variations of the received signal and converting this signal to a digital word using an analog to digital converter (not specifically shown). While the advantages of the instant invention would be available to those decoders that use the signal strength indications directly as the respective channel quality indications the preferred embodiment of the instant invention goes farther.

Specifically, the signal strength indication, at output (23), is coupled to the averaging apparatus (31) and to input (33) of the difference circuit (39). The averaging apparatus (31) averages a plurality of the signal strength indications to provide an average signal strength at input (37) of the difference circuit (39). The plurality of the signal strength indications, in the preferred embodiment, has been selected to include all symbol time periods in a data block but could be limited to fewer indications so long as the average extends over a time period that exceeds the expected duration of a channel anomaly, such as a fade. At any rate, the plurality (specifically the equivalent number of data symbols) will depend on the symbol time period for a particular data rate. In any event the output of the difference circuit (39) is coupled to an index function (35), explained further below, at input (40). The output of difference circuit (39) is the channel quality indication corresponding to the symbol time period that in turn depends on the respective signal strength indication together with the average signal strength indication.

Additionally the signal at input (17) is coupled to a demodulator, in a preferred embodiment a soft decision demodulator (25), which provides demodulated symbols in a digital format to a decision circuit (27) at input (29). These demodulated symbols may or may not be corrupted because of anomalies of the channel, such as fading, noise, etc. The soft decision demodulator (25) is well known in the art but will vary according to the particular form of modulation used. For example in the preferred embodiment, frequency modulation is employed and a frequency discriminator followed by an analog to digital converter is appropriate. While the soft decision demodulator (25) is preferred due to certain performance enhancements, a hard decision demodulator could be substituted without affecting the advantages of the instant invention.

The decision circuit (27) in practice is an integrated circuit executing an algorithm, detailed below, directed to the end of data decoding. Alternative embodiments of the instant invention could replace the integrated circuit with a digital signal processor or microprocessor based circuit and the appropriate software algorithms.

The indexing function (35) selects a predetermined value corresponding respectively to each symbol time period that depends on the channel quality indication at input (40). The predetermined value represents a simple machine operation, for example a number, varying between 3 and 10, of right register shift operations in a preferred embodiment. The predetermined value could represent other simple machine operations for example a left register shift or a simple addition or subtraction of a predetermined number. At any rate this is accomplished by the indexing function (35) which converts the channel quality indication at input (40) to an address for a look-up table (41). In the preferred embodiment the channel quality indication is quantized into one of 32 possible addresses. The look-up table (41) contains a plurality of predetermined values one of which is selected by entering the table at the address corresponding the channel quality indication at input (40). The predetermined value thus selected is provided to the decision circuit (27) at input (42). In FIG. 2 this is functionally depicted as an indexing switch (43) selecting, in accordance with the channel quality indication, an address (45) to the look-up table (41). The decision circuit (27) is arranged for weighting a decoder decision for the symbol time period in accordance with the predetermined value at input (42).

Figure 3:
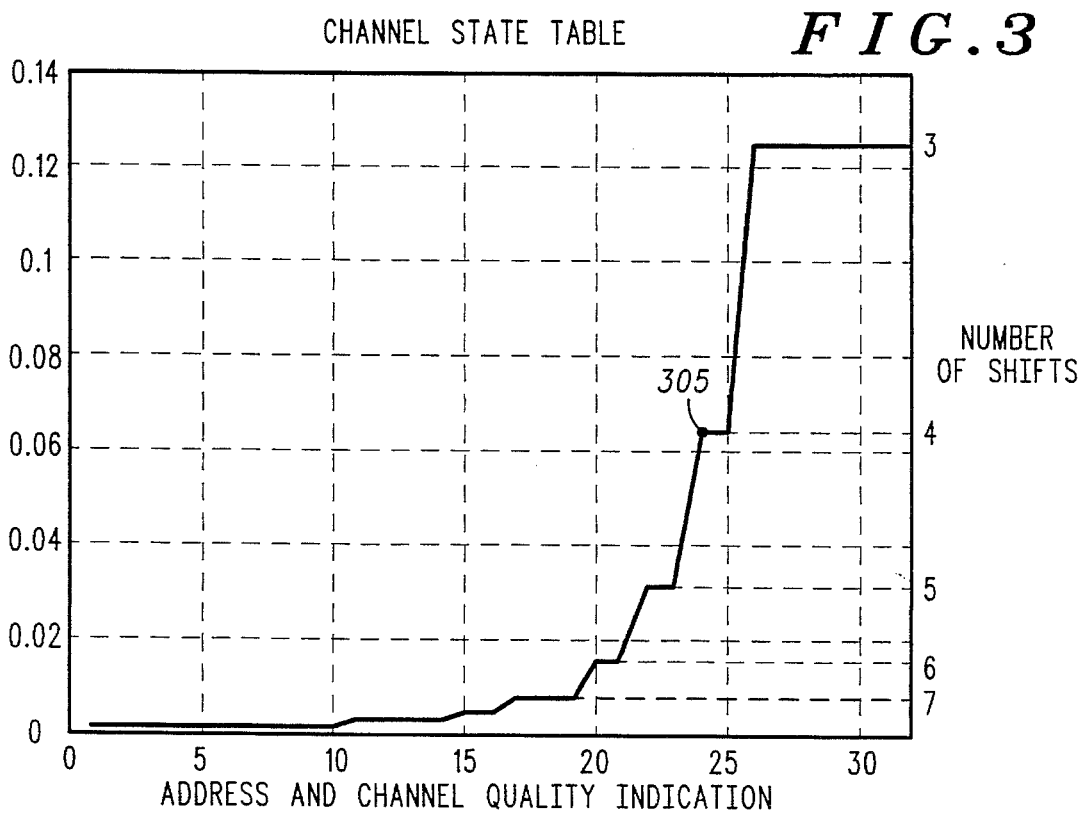
FIG. 3 is a representative channel state table suitable for use in the FIG. 2 embodiment.

Referring to FIG. 3, an exemplary look up table suitable for use in the FIG. 2 embodiment is depicted. The horizontal axis in FIG. 3 is the channel quality indication quantized to integer addresses while the right hand vertical axis indicates the contents of the table, specifically the predetermined values stored within the table. The left hand vertical axis corresponds to a number that is equivalent to 2 raised to the negative power indicated by the predetermined value on the right hand vertical axis. For example, if the table is entered at the address 26 on the horizontal axis a predetermined value of 3 is found as depicted on the right hand vertical axis. When 2 is raised to the power of $-3$ the decimal number 0.125 results as depicted on the left hand vertical axis. The relevance of this explanation is evidenced by noting that a right register shift operation is the logical equivalent of dividing the contents of the register by 2 or if you will multiplying the contents by 0.5. Thus the computationally complex operation of multiplying can be replaced by a simple machine operation, specifically one or more right or left register shifts by limiting such multiplications to multiples of 2. Hence the decision circuit (27) can in effect weight any potential decoder decisions in accordance with the predetermined value at input (42) by merely performing a logical right register shift operation on such a derision.

By observation of FIG. 3, the predetermined values monotonically, although not uniquely, correspond to the channel quality indication or more specifically the address on the horizontal axis. Experimentally it has been determined that more favorable decoder accuracy is achieved when the range of predetermined values includes all or the majority of the expected range of channel quality indications. This is achieved when the channel quality indication under average or normal or typical circumstances corresponds to the point (305), located to the right of the point of inflexion in FIG. 3. Under these circumstances a preferred embodiment provides assurance that deep fades in signal strength, prevalent in a Rayleigh fading environment, are accurately captured within the limited capability or range of the lookup table of FIG. 3.

This predetermined value allows consideration of the channel quality for the relevant symbol time period in a computationally efficient manner. Such a predetermined value can be so advantageously utilized in decoders arranged to provide forward error correction capability on channels employing data coding arrangements, such as convolutionally encoded data.

By way of simplified example and as is well known in the art, consider a rate ½ (7, 5) convolutional code wherein each data bit is encoded as two bits and further gray coded as symbols. The values of these two bits will depend on the present data bit and the previous two data bits (the encoder state). Consider a data stream, 0, 1, 0, 0, 0, 0, the stream convolutionally encoded as 00, 11, 10, 11, 00, 00, and further gray coded to the symbol sequence +3, −1, −3, −1, +3, +3 (00=+3, 11=−1, 10=−3, & 01=+1 for this gray code).

This sequence is then transported over the channel and, in accordance with the above described embodiment, received and decoded to provide data at output (19). Suppose due to channel corruption, the demodulated symbols provided by soft decision demodulator (25) at input (29) of decision circuit (27) is the sequence +1, −1, +1, −1, +3, +3.

Figure 4:
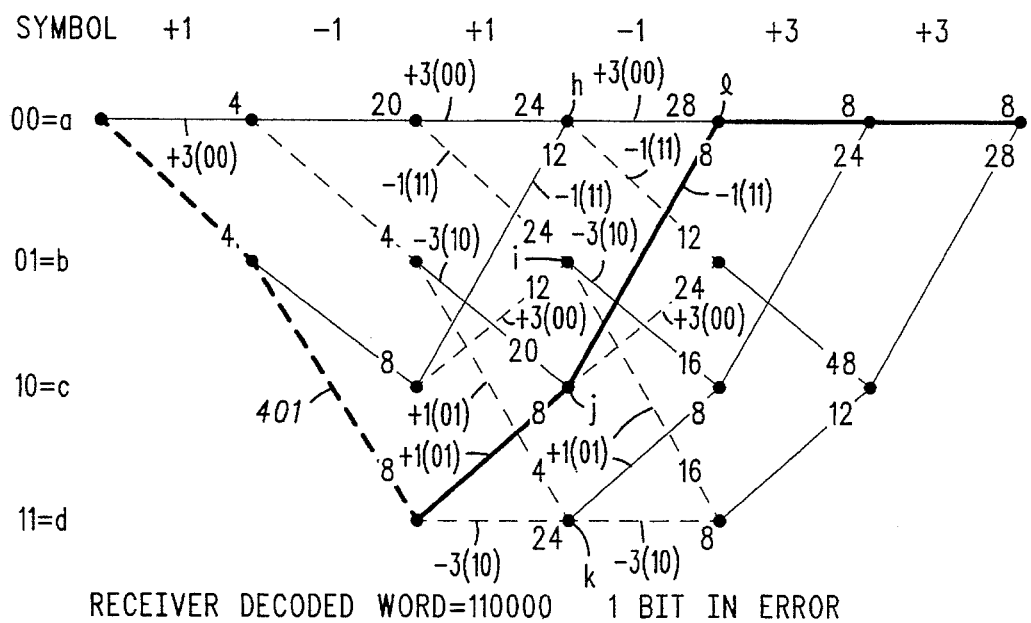
FIG. 4 is a trellis diagram of an exemplary rate ½ (7, 5) convolutional code using prior art Viterbi decoding.

Referring to FIG. 4, a trellis diagram for this convolutional code is depicted. As is understood in the art, this trellis diagram represents all states (a=00, b=01, c=10, d=11) of the encoder and, moving from left to right through the trellis diagram, all possible branches between states, conditioned on the added assumption that a cleared (all zero) encoder exists initially and finally. Here each of the 4 states (a, b, c, d), representing a unique combination of two bits, designates a vertical position within the trellis diagram. Generally, moving from left to right (representing the lapse of time where each branch corresponds to a symbol time period), 2 possible branches, representing each of two values for a data bit, begin at each node, for example (h, i, j, k). Similarly, in general two branches end at each node. Exceptions to these general comments are the result of the cleared conditions noted above. By convention a dotted line represents a branch resulting from a "1" data bit and a solid line represents a branch resulting from a "0" data bit.

Next with reference to FIG. 4, a generalized description of the function of prior art decision circuits will be undertaken. All branches incident on and emanating from nodes (h, i, j, k) have been labeled with their corresponding symbol and two bit convolutionally encoded pattern. It is to be understood that all other same situated but temporally spaced branches have identical corresponding symbols. Additionally each branch incident on a node has been designated with a number corresponding to the weight of a composite path consisting of that branch plus the lowest weight predecessor path. The weight of a branch is calculated as the square of the difference between the symbol corresponding to that branch denoted as "r" and the demodulated symbol corresponding to that symbol time period denoted as "R". For example, consider node (h) and the branch with a weight designation of 24. This branch corresponds to a +3 symbol and the demodulated symbol was +1. Thus $(r-R)^2=(+3-+1)^2=2^2=4$. The predecessor path (one only in this case) has a cumulative weight of 20. Adding 20 to 4 gives a cumulative weight of 24 for the path ending with this branch incident on node (h).

As one more example indicative of this (Viterbi) decoding rule, consider node (1) and the branch with a weight designation of 28. This branch corresponds to a +3 symbol and a demodulated symbol of −1. Thus $(r-R)^2=(+3-(-1))^2=4^2=16$. In this case there are two potential predecessor paths (specifically each of the branches incident to node h), having respectively a weight designation of 24 and 12. The decision rule to be followed in this case is select the lowest weight predecessor path and discard all others. Therefore select the branch with weight 12 and discard the branch with weight 24. Hence the cumulative weight is 28, specifically 16 (calculated above) plus 12 from the surviving path for a total of 28 as depicted.

Ultimately, decoding a specific received sequence amounts to reverse traversing the trellis diagram following the lowest weight branches (thus lowest cumulative weight path) keeping in mind that a solid line represents a "0" and a dashed line represents a "1". Thus reverse traversing the FIG. 4 trellis diagram using the Viterbi algorithm yields a path (401) corresponding, from left to right, to a symbol sequence of −1, +1, +1, −1, +3, +3 and a data sequence at output (19) of 1, 1, 0, 0, 0, 0. By comparison with the original transmit data sequence this represents one erroneous bit.

As is known in the art the one erroneous bit in the above situation could have been correctly decoded if a channel quality indication were available. For example, by using the channel quality indication depicted in FIG. 5 and weighting the branches of FIG. 4 in accordance with this channel quality indication, specifically by multiplying each branch weight by it's respective channel quality indication, an accurate decoding decision will result. The reader is left to his own to show this or alternatively an explanation may be found in co-pending application Ser. No. 064,308 filed May 18, 1993 and assigned to the same assignee as the present invention. However, to arrive at these results, incorrect in the first case depicted in FIG. 4, required in this simplified example eight multiplication operations, one for each possible branch in the diagram, for each symbol time period. To arrive at the correct results required, in addition to the above eight an additional eight multiplication operations, again one for each branch, for each symbol time period.

Figure 5:
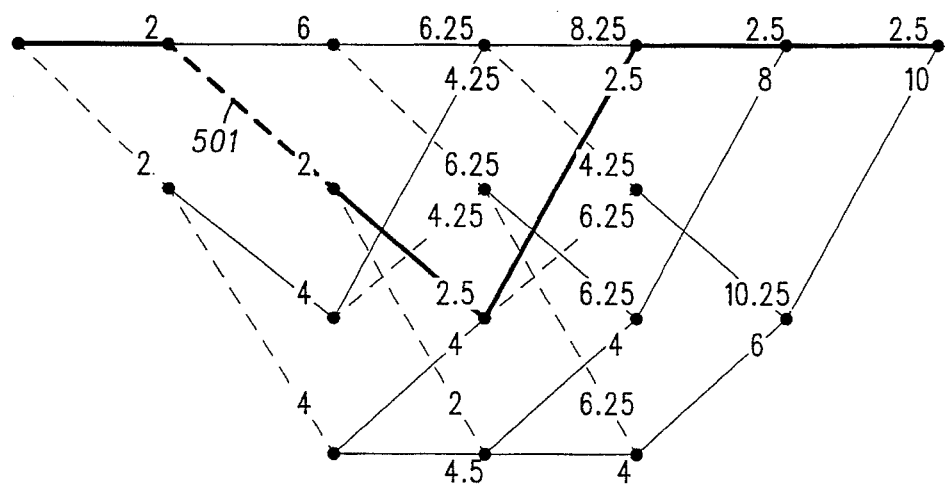
FIG. 5 is a trellis diagram of the FIG. 4 rate ½ convolutional code illustrative of the operation of a preferred embodiment of the instant invention.

With reference to FIG. 5, the operation of an embodiment of the instant invention will now be contrasted with the above. Unless otherwise herein indicated, all other information, operation, and hypothetical data patterns, etc. are identical to those utilized for the FIG. 4 descriptions. Recall from the preceding description of FIG. 2 that the decision circuit (27) has available a demodulated symbol sequence and a corresponding channel quality indication, specifically a predetermined value, for each symbol of the symbol sequence. These predetermined values depicted in FIG. 5 in sequence are hypothesized and normalized to 2 to the minus 3 power ($2^{-3}$) for the sake of simplicity. The branch weights in FIG. 5 are calculated by taking the absolute value of the difference between the symbol that corresponds to a particular branch "r" and the demodulated symbol for that symbol time "R" and performing a right register shift on this absolute value. In sum the instant invention uses |r−R| rather than $(r-R)^2$ in the decoding process. In terms of computational complexity setting the most significant bit denoting algebraic polarity, in a register that contains r−R to a logical "0" has been substituted for a multiplication. Additionally three sequential right register shifts have been performed on the resultant absolute values for each branch corresponding to the third symbol in FIG. 5 rather than a multiplication by 0.125. The branches in FIG. 5 include a cumulative path weight designation calculated using the preceding rules.

By observation, reversing traversing the FIG. 5 trellis diagram now yields a path (501) corresponding, from left to right, to a symbol sequence of +3, −1, −3, −1, +3, +3 and a data sequence at output (19) of 0, 1, 0, 0, 0, 0. By comparison with the original transmit data stream all data bits have been correctly decoded and this has been accomplished while at the same time eliminating up to 16 multiplications for each symbol time period. The full consequences of this may be further appreciated by noting that even in a practical application a decoding task that historically employed a digital signal processor has been reduced to an application specific integrated circuit. This has allowed significant savings in power consumption, cost and physical space.

Figure 6:
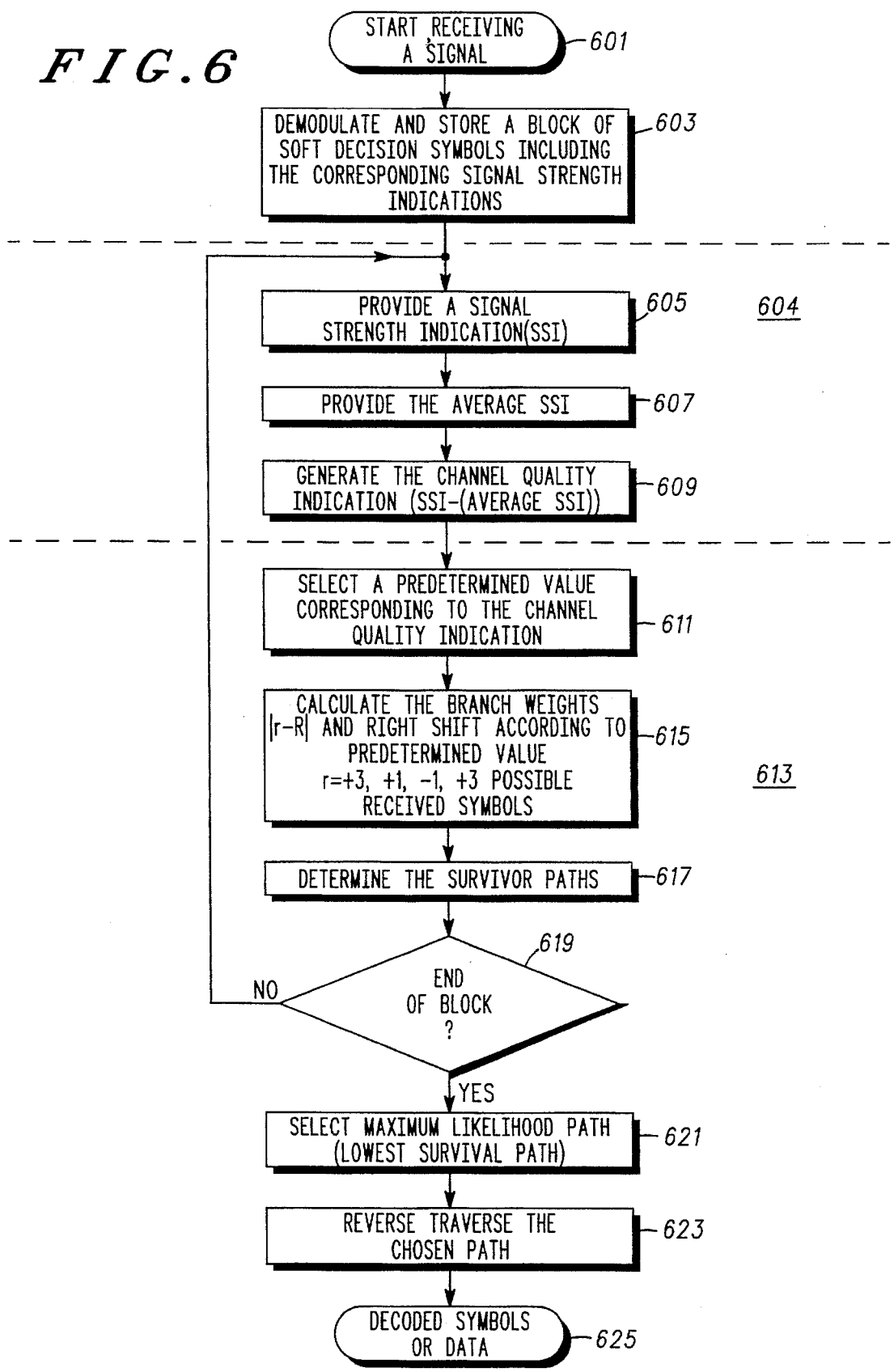
FIG. 6 is a process flow chart exemplifying a method embodiment of the instant invention.

An understanding of the instant invention, embodied as a process, is facilitated by the FIG. 6 process flow diagram. In FIG. 6 a signal is being received at step (601). At step (603) a block of soft decision symbols "R" and the corresponding signal strength indications are demodulated and stored. At step (604) including steps (605, 607, 609) a channel quality indication for each symbol "R" is provided. Specifically a signal strength indication corresponding to the soft decision symbol "R" is retrieved or otherwise provided at step (605). A average signal strength is provided at step (607). On the preferred embodiment this average is calculated one time for each block of symbols however as noted earlier this may be varied. At step (609) a channel quality indication is provided or generated by taking the difference between the signal strength indication from step (605) and the average signal strength from step (607). Next a predetermined value corresponding to the channel quality indication and representative of a simple machine operation such as a logical operation like a register shift or absolute value operation or alternatively an addition or subtraction operation is selected at step (611). Last, at step (613) this predetermined value, specifically what the value represents is utilized in weighting a decoder decision for the symbol time period corresponding to the soft decision symbol "R".

Focusing on step (613), in an embodiment using the Viterbi algorithm and operating to decode data that has been convolutionally encoded, a set of branch weights are calculated at step (615). These branch weights correspond to the symbol time period associated with soft decision symbol "R" and equal |r–R| right registered shifted a number of times equivalent to the predetermined value from step (611), where "r" is a possible symbol in the convolutional code, such as +3, +1, –1, –3. At step (617) the surviving paths are determined and all others incident on a specific node are dropped (see explanation supra). If an entire data block has not been received at step (619) the process loops back to step (604) and continues. If the complete data block has been received, the maximum likelihood path, specifically the lowest weight surviving path is selected at step (621) and reverse traversed at step (623) to extract the decoded symbols or data at step (625).

The above discussion of exemplary results indicates that the shortcoming of the prior art have been addressed. In particular the preferred embodiment demonstrates a data decoder having improved computational efficiency that eliminates all multiplication operations from the viterbi trellis decoding algorithm and substitutes therefore simple machine operations, such as logical operations. This simplification of the viterbi algorithm has facilitated implementation of the instant data decoder in an application specific integrated circuit at significant physical space and power consumption savings. Further, experimental results of one embodiment have confirmed equivalent if not superior performance for the instant invention over a range of channel conditions. These experiments were conducted on a rate ¾, constraint length 6, trellis coded data stream operating at 19.2 Kbits/s. Those skilled in the art will recognize that the true scope and spirit of the instant invention extends well beyond the particulars disclosed herein.

What is claimed is:

1. A computationally efficient data decoder operating to decode symbols recovered from a signal received over a channel, comprising in combination:

measurement means for providing a channel quality indication, said channel quality indication corresponding to a symbol time period;

indexing means, coupled to said measurement means, for selecting a predetermined value corresponding to said symbol time period; and decision means for weighting a decoder decision for said symbol time period in accordance with said predetermined value by performing a right or left register shift operation on said decoder decision for said symbol time period.

2. The data decoder of claim 1 wherein said channel quality indication depends on a plurality of symbol time periods.

3. The data decoder of claim 2 wherein said weighting a decoder decision further includes taking an absolute value of a distance between a recovered symbol and a possible symbol.

4. A computationally efficient trellis data decoder operating to decode convolutionally encoded symbols recovered from a signal received over a channel, comprising in combination:

measurement means for providing a signal strength indication of the signal corresponding to a symbol time period;

indexing means, coupled to said signal strength means, for selecting a predetermined value corresponding to said signal strength indication; and decision means, operating as a trellis decoder, for selecting a symbol for said symbol time period to provide a decoded symbol, said decoded symbol corresponding to a branch of said trellis decoder, said branch weighted in accordance with a procedure that includes performing a right or left register shift operation.

5. The data decoder of claim 4 wherein said signal strength indication depends on a plurality of symbol time periods.

6. The data decoder of claim 5 wherein said signal strength indication depends on a signal strength for said symbol time period and an average signal strength for said plurality of symbol time periods.

7. The data decoder of claim 5 wherein said right or left register shift operation is performed on an absolute value of a distance between a recovered symbol and a possible symbol.

8. In a computationally efficient data decoder operating to decode symbols recovered from a signal received over a channel, a method including the steps of:

providing a channel quality indication, said channel quality indication corresponding to a symbol time period;

selecting, responsive to said channel quality indication a predetermined value corresponding to said symbol time period; and weighting a decoder decision for said symbol time period in accordance with said predetermined value by performing a right or left register shift operation on said decoder decision.

9. The method of claim 8 wherein said channel quality indication depends on a plurality of symbol time periods.

10. The method of claim 9 wherein said step of weighting a decoder decision further includes taking an absolute value of a distance between a recovered symbol and a possible symbol.

11. In a computationally efficient trellis data decoder operating to decode convolutionally encoded symbols recovered from a signal received over a channel, a method including the steps of:

providing a signal strength indication of the signal corresponding to a symbol time period;

selecting a predetermined value corresponding to said signal strength indication; and selecting a symbol for said symbol time period to provide a decoded symbol, said decoded symbol corresponding to a branch of a trellis data decoder, said branch weighted in accordance with a procedure that includes performing a right or left register shift operation.

12. The method of claim 11 wherein said signal strength indication depends on a plurality of symbol time periods.

13. The method of claim 12 wherein said signal strength indication depends on a signal strength for said symbol time period and an average signal strength for said plurality of symbol time periods.

14. The method of claim 12 wherein said right or left register shift operation is performed on an absolute value of a distance between a recovered symbol and a possible symbol.

* * * * *